United States Patent
Wu et al.

(10) Patent No.: US 9,985,253 B2
(45) Date of Patent: May 29, 2018

(54) METHOD OF MANUFACTURING LIGHT SCATTERING LAYER AND ORGANIC LIGHT-EMITTING DIODE

(71) Applicant: WUHAN CHINA STAR OPTOELECTRONICS TECHNOLOGY CO., LTD., Wuhan, Hubei (CN)

(72) Inventors: Zhiyong Wu, Hubei (CN); Liang Xu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days. days.

(21) Appl. No.: 15/128,119

(22) PCT Filed: Apr. 27, 2016

(86) PCT No.: PCT/CN2016/080410
§ 371 (c)(1),
(2) Date: Sep. 22, 2016

(87) PCT Pub. No.: WO2017/173684
PCT Pub. Date: Oct. 12, 2017

(65) Prior Publication Data
US 2017/0294625 A1    Oct. 12, 2017

(30) Foreign Application Priority Data
Apr. 8, 2016 (CN) .......................... 2016 1 0216452

(51) Int. Cl.
*H01L 51/52* (2006.01)
*H01L 51/56* (2006.01)

(52) U.S. Cl.
CPC .......... *H01L 51/56* (2013.01); *H01L 51/5268* (2013.01); *H01L 2251/301* (2013.01)

(58) Field of Classification Search
None
See application file for complete search history.

(56) References Cited

U.S. PATENT DOCUMENTS

2007/0280318 A1* 12/2007 Yoshimoto ............. B82Y 20/00
372/43.01
2008/0284320 A1* 11/2008 Karkkainen ........... B82Y 20/00
313/504

(Continued)

FOREIGN PATENT DOCUMENTS

CN          101065831 A        10/2007
CN          102041539 A         5/2011

(Continued)

*Primary Examiner* — Joseph Schoenholtz
(74) *Attorney, Agent, or Firm* — Mark M. Friedman

(57) ABSTRACT

A method of manufacturing a light scattering layer and an organic light-emitting diode are provided. The manufacturing method includes: depositing a material having a low refractive index value in hole structures of a mask on a base; removing the mask, and forming a plurality of raised structures on the base; depositing a material having a high refractive index value between the raised structures to form a planarization layer, thereby manufacturing a light scattering layer constituted by the raised structures and the planarization layer on the base. The manufacturing method has the advantages of being simple to prepare, low-cost, etc.

19 Claims, 7 Drawing Sheets

(56) References Cited

U.S. PATENT DOCUMENTS

2008/0318003 A1  12/2008  Chua et al.
2012/0241771 A1   9/2012  Kato et al.
2013/0181242 A1   7/2013  Cho

FOREIGN PATENT DOCUMENTS

CN      102694128 A    9/2012
CN      102903608 A    1/2013

* cited by examiner

METHOD OF MANUFACTURING LIGHT SCATTERING LAYER AND ORGANIC LIGHT-EMITTING DIODE

FIELD OF THE INVENTION

The present invention relates to the field of display technology, and more particularly to a method of manufacturing a light scattering layer and an organic light-emitting diode having the light scattering layer manufactured by the method.

BACKGROUND OF THE INVENTION

Organic Light-Emitting Diode (OLED) is a display technology with self-light emitting characteristics, and it uses extremely thin organic material coating and glass substrate. When current passes therethrough, the organic material will emit light. Since the OLED has several advantages, such as high contrast degree, wide viewing angle, low power consumption, simple structure, lightweight, and flexible, it is gradually replacing thin-film-transistor liquid crystal displays (TFT-LCD) and has received the most attention recently.

However, when the light propagates through the OLED device, a plurality of modes, such as plasma mode, wave guide mode, and substrate mode, are presented, and cannot be avoided. These modes result in that the light from the OLED device cannot be highly efficiently coupled into air, thereby restricting the efficiency of the light emission of the OLED. In these modes mentioned above, the main factor restricting the efficiency of the light emission of the OLED is the wave guide mode.

In order to reduce the production of the wave guide mode, two approaches are generally used. One of the approaches is to reduce the wave guide mode by using a photonic crystal. That is, an ITO surface is etched by ion beam, so as to form an ordered structure, and form a two dimensional photonic crystal with the adjacent organic material layer. However, the manufacturing process is complicated and expensive. Also, a layer of the photonic crystal is manufactured by a nano-stamping method and located between the ITO and the glass base. Due to the photonic crystals with different periods need to be manufactured by different stamping moldings, the manufacturing cost will be increased. The other approach is adding a light scattering layer between the ITO and the glass base. The light scattering layer is a $SiO_2$ layer with low refractive index and a grid structure, and is manufactured by a photolithography process; notwithstanding the light scattering layer can achieve reducing the wave guide mode, the manufacturing process is complicated and it is difficult to control parameters caused from the organic layers being stacked with a waved configuration. Moreover, the light scattering layer located between the ITO and the glass base is doped with low refractive index particles and bubbles which have different masses and sizes; there are great differences between these particles, so it is difficult to control the light scattering effect.

Accordingly, it is necessary to provide a method of manufacturing a light scattering layer and an organic light-emitting diode having the light scattering layer manufactured by the method, such that the manufacturing process of the light scattering layer is simple, and the manufacturing cost is decreased, and light scattering layers having a highly controllable light scattering effect can be produced in a mass production manner. In the organic light-emitting diode having the light scattering layer which is manufactured by the method of the present invention, since the light scattering layer is provided, the original total reflection light will emit out, whereby the presentence of the wave guide mode is avoided and a light extraction efficiency of the OLED is enhanced.

SUMMARY OF THE INVENTION

The present invention provides a method of manufacturing a scattering layer and an organic light-emitting diode having the light scattering layer using the same, so as to solve the technical problems of complicated manufacturing process, scattering effect being hard to control, and high manufacturing cost caused from avoiding the presentence of the wave guide mode through the conventional approaches. Also, using the organic light-emitting diode having the light scattering layer which is manufactured by the method of the present invention, the presentence of the wave guide mode can be substantially reduced and the light extraction efficiency of the OLED is enhanced.

The present invention provides a method of manufacturing a light scattering layer, comprises:

manufacturing a mask on a base, the mask having a plurality of hole structures;

depositing a material having a first refractive index value in the hole structures of the mask;

removing the mask after the material having the first refractive index value is deposited, thereby forming a plurality of raised structures on the base;

depositing a material having a second refractive index value between the plurality of raised structures for forming a planarization layer which is used for covering the plurality of raised structures, thereby manufacturing a scattering layer which is constituted by the plurality of raised structures and the planarization layer on the base, wherein the second refractive index value is greater than the first refractive index value.

In the method of manufacturing the light scattering layer of the present invention, the step of manufacturing a mask having a plurality of hole structures on a base comprises:

employing an open mask on the base and manufacturing an aluminum film by the open mask, where a pattern of the aluminum film is the same as a pattern of the open mask by using a vacuum evaporation method or a physical vapor deposition method;

anodizing the aluminum film first time and removing an aluminum oxide formed by oxidation, so as to form the aluminum film having a plurality of notches each having a hexagonal close-packed structure;

anodizing the aluminum film having the plurality of notches each having a hexagonal close-packed structure second time until aluminum located under the notches is completely oxidized to form the hole structures.

In the method of manufacturing the light scattering layer of the present invention, a thickness of the aluminum film is in a range between 2 micrometers and 10 micrometers.

In the method of manufacturing the light scattering layer of the present invention, processes of the first anodization and second anodization of the aluminum film are performed in an oxalic acid solution.

In the method of manufacturing the light scattering layer of the present invention, the step of removing an aluminum oxide formed by oxidation comprises: removing the aluminum oxide by using a sodium hydroxide solution.

In the method of manufacturing the light scattering layer of the present invention, in the step of depositing a material having a first refractive index value in the hole structures of the mask, the depositing process is performed by using a vacuum evaporation method, a physical vapor deposition method, a chemical vapor deposition method, or a pulsed laser deposition method.

In the method of manufacturing the light scattering layer of the present invention, the raised structures comprise hemispherical-shaped raised structures or columnar raised structures.

In the method of manufacturing the light scattering layer of the present invention, the material having the first refractive index value is selected from the group consisting of a silicon-glass bonding structure material, a silicon dioxide material, and an aerogel material.

In the method of manufacturing the light scattering layer of the present invention, the material having the second refractive index value is selected from the group consisting of a silicon nitride material, a tin indium oxide material, and a zinc selenide material.

In the method of manufacturing the light scattering layer of the present invention, the base comprises a glass base.

The present invention also provides another method of manufacturing a light scattering layer, comprising:

manufacturing a mask on an aluminum foil, the mask having a plurality of hole structures, and transferring the mask to a base;

depositing a material having a first refractive index value in the hole structures of the mask;

removing the mask after the material having the first refractive index value is deposited, thereby forming a plurality of raised structures on the base;

depositing a material having a second refractive index value between the plurality of raised structures for forming a planarization layer which is used for covering the plurality of raised structures, thereby manufacturing a light scattering layer which is constituted by the plurality of raised structures and the planarization layer on the base, wherein the second refractive index value is greater than the first refractive index value.

In another method of manufacturing the light scattering layer of the present invention, the step of manufacturing a mask having a plurality of hole structures on an aluminum foil comprises:

anodizing the aluminum foil first time until aluminum in the aluminum foil is no longer being oxidized, and removing an aluminum oxide formed by oxidation, so as to form a plurality of notches each having a hexagonal close-packed structure in the aluminum foil;

anodizing the aluminum foil having the plurality of notches each having hexagonal close-packed structure second time until aluminum located under the notches is oxidized to form regular hole structures;

sequentially removing a residual aluminum in the aluminum foil having the hole structures and an aluminum oxide located around a bottom of the hole structures, thereby forming the mask having the plurality of hole structures.

In another method of manufacturing the light scattering layer of the present invention, processes of the first anodization and second anodization of the aluminum foil are performed in an oxalic acid solution.

In another method of manufacturing the light scattering layer of the present invention, the step of removing an aluminum oxide formed by oxidation comprises: removing the aluminum oxide by using a sodium hydroxide solution.

In another method of manufacturing the light scattering layer of the present invention, the step of removing a residual aluminum in the aluminum foil having the hole structures comprises: removing the residual aluminum by using a copper chloride solution.

In another method of manufacturing the light scattering layer of the present invention, the step of removing an aluminum oxide located around a bottom of the hole structures comprises: removing the aluminum oxide located around the bottom of the hole structures by using a phosphoric acid solution.

In another method of manufacturing the light scattering layer of the present invention, the material having the first refractive index value is selected from the group consisting of a silicon-glass bonding structure material, a silicon dioxide material, and an aerogel material.

In another method of manufacturing the light scattering layer of the present invention, the material having the second refractive index value is selected from the group consisting of a silicon nitride material, a tin indium oxide material, and a zinc selenide material.

In another method of manufacturing a scattering layer of the present invention, the raised structures comprise hemispherical-shaped raised structures or columnar raised structures.

The present invention also provides an organic light-emitting diode, comprising a cathode, an organic material layer, an ITO anode, and a base. The organic light-emitting diode further comprises a light scattering layer obtained from any one of the manufacturing methods mentioned above, the light scattering layer is located between the ITO anode and the base, or the light scattering layer is located on a side of the cathode.

In comparison to the prior art, in the method of manufacturing the light scattering layer of the present invention, the mask having the plurality of hole structures is directly manufactured on the base, or the mask is firstly manufactured on the aluminum foil, and then the mask is transferred to the base. Then, the material having the first refractive index value is deposited in the hole structures of the mask, so as to form the plurality of raised structures which are planarized by using the material having the second refractive index value to form the planarization layer, thereby manufacturing the light scattering layer which is constituted by the plurality of raised structures and the planarization layer on the base. The process of manufacturing the light scattering layer is simple, and the manufacturing cost is low. The light scattering effect of the light scattering layer can be accurately controlled by controlling the factors of the shape or the quantity of the raised structures. Moreover, by using this method, scattering layers having same internal structure can be produced in a mass process, so as to solve the technical problems of scattering layers having different scattering effects caused from the internal structure of the light scattering layer being arranged randomly. In addition, the light scattering layer with an appropriate internal structure may be prepared according to actual requirements, thereby obtaining different scattering effects.

In the organic light-emitting diode of the present invention, the light scattering layer is manufactured by using the light scattering layer manufacturing method of the present invention. By disposing the light scattering layer between the ITO anode and the base, or on a side of the cathode, the presentence of the wave guide mode formed from transmitting the light through the organic light-emitting diode can be substantially reduced, such that the light existing in the wave guide mode can emit out, thereby enhancing the light extraction efficiency of the organic light-emitting diode.

DETAILED DESCRIPTION OF THE INVENTION

Figure 1:
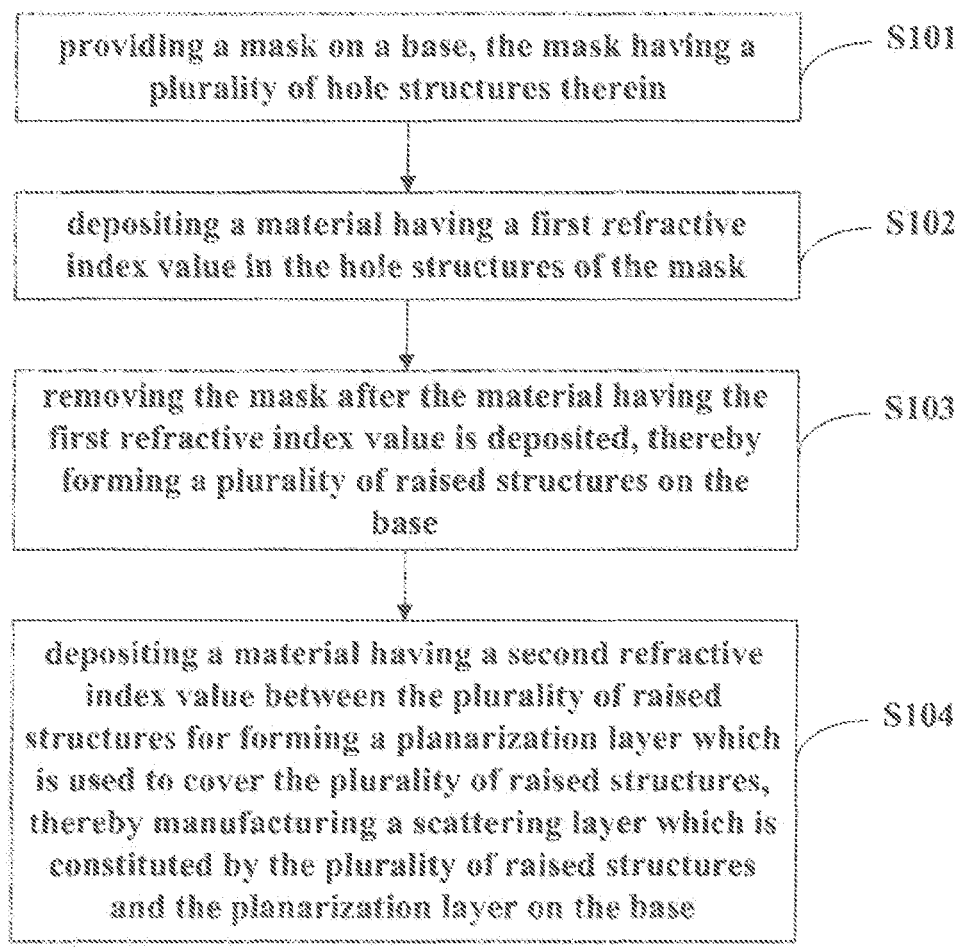
FIG. 1 is a flow chart of a method of manufacturing a light scattering layer in accordance with a first preferred embodiment of the present invention.

Referring to the drawings, a same component symbol represents a same component. The following descriptions are based on illustrated specific embodiments of the present invention, and should not be regarded as limitations on other specific embodiments of the present invention that are not described in detail herein.

Please refer to FIG. 1, which is a flow chart of a method of manufacturing a light scattering layer in accordance with a first preferred embodiment of the present invention. The manufacturing method comprises:

Step S101, providing a mask on a base, the mask having a plurality of hole structures therein;

Step S102, depositing a material having a first refractive index value in the hole structures of the mask;

Step S103, removing the mask after the material having the first refractive index value is deposited, thereby forming a plurality of raised structures on the base;

Step S104, depositing a material having a second refractive index value between the plurality of raised structures for forming a planarization layer which is used to cover the plurality of raised structures, thereby manufacturing a scattering layer which is constituted by the plurality of raised structures and the planarization layer on the base, wherein the second refractive index value is greater than the first refractive index value.

The specific processes of each step of the method of manufacturing the light scattering layer of this preferred embodiment are descripted below.

Figure 2:
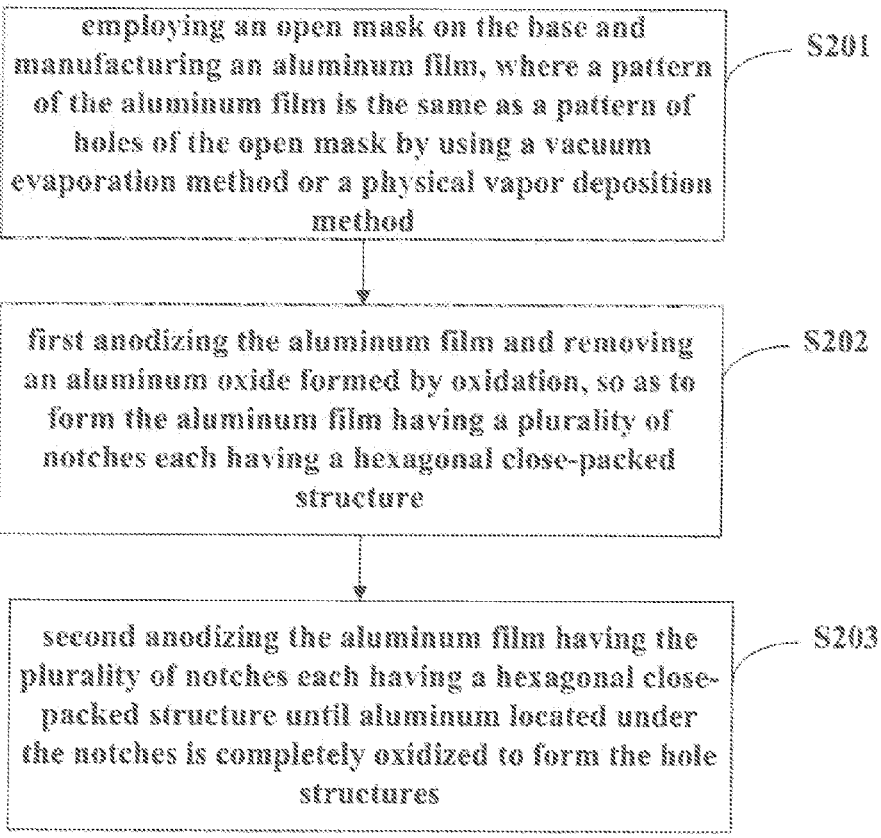
FIG. 2 is a flow chart of a method of manufacturing a mask according to the first preferred embodiment of the present invention.

In the step S101, the mask having the plurality of hole structures is provided on the base. The specific process of providing the mask refers to FIG. 2, which is a flow chart of a method of manufacturing the mask according to the first preferred embodiment of the present invention.

The method of manufacturing the mask comprises:

Step S201, employing an open mask on the base and manufacturing an aluminum film, where a pattern of the aluminum film is the same as a pattern of holes of the open mask by using a vacuum evaporation method or a physical vapor deposition method;

Step S202, first anodizing the aluminum film and removing an aluminum oxide formed by oxidation, so as to form the aluminum film having a plurality of notches each having a hexagonal close-packed structure;

Step S203, second anodizing the aluminum film having the plurality of notches each having a hexagonal close-packed structure until aluminum located under the notches is completely oxidized to form the hole structures.

Figure 3:
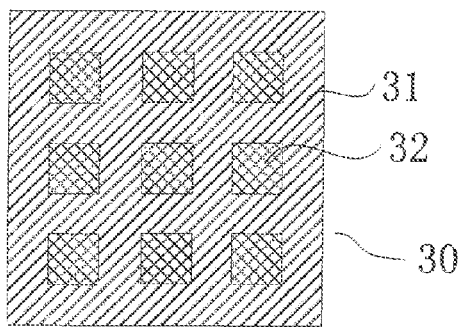
FIG. 3 is a structural diagram of an open mask according to the first preferred embodiment of the present invention.

In the step S201, the structure of the open mask is as shown in FIG. 3, which is a structural diagram of the open mask according to this preferred embodiment. The open mask 30 comprises shielding sections 31 and opening sections 32. The open mask 30 is disposed on the base. The aluminum is deposited on the base through the opening sections 32 by using the vacuum evaporation method or the physical vapor deposition method. The aluminum will not be deposited on the portion of the base which is shielded by the shielding sections 31, thereby forming the aluminum film, where a pattern of the aluminum film is the same as the pattern of the opening sections 32 of the open mask 30. The aluminum film includes a plurality of independent sub-aluminum films. In this preferred embodiment, the quantity of the sub-aluminum films is the same as the number of the opening sections 32. That is, there are nine sub-aluminum films.

When the aluminum film is deposited on the base, the thickness of the aluminum film can be controlled in a range of 2 micrometers and 10 micrometers. In the other embodiments, the thickness of the aluminum film may be less than 2 micrometers or greater than 10 micrometers. In this preferred embodiment, the structure of the open mask shown on FIG. 3 is exemplary and explanatory only and is not restrictive of the present invention. In the other embodiments, an open mask having different patterns can be employed, which will not be specifically restricted in the invention.

When the film is formed with a large area, in order to reduce the difference in stress between adjacent layers, the aluminum film can be annealed after the step S201. The annealing process belongs to existing technology, which those skilled in the art can carry out based on their general knowledge, and will not be described in detail here.

In the step S202, the aluminum film is first anodized by using the oxalic acid solution. The surface of the aluminum is rapidly oxidized to form a layer of aluminum oxide, such that the aluminum film is constituted by a non-oxide aluminum layer and an aluminum oxide layer. Due to the surface of the aluminum oxide layer having asperities, the current in the recesses of the asperities is great, whereby the oxidation speed therein by the oxalic acid solution is fast. Moreover, current at the protrusions of the asperities is small, whereby the oxidation speed thereat by the oxalic acid solution is slow. Thus, the recesses will extend transversely and longitudinally, thereby forming notches. The protrusions form as side walls of the notches formed by the recesses. By controlling the time of performing the first anodizing, the aluminum film having the notches can be obtained. The lower half portion of the notch is extended into the non-oxide aluminum layer, and is formed with a regular hexagonal close-packed structure. The upper half portion of the notch is located in the newly formed aluminum oxide layer. It should be noted that the transverse direction and the longitudinal direction are respectively used to refer a direction parallel to the surface of the aluminum film and a direction perpendicular to the surface of the aluminum film.

Figure 4:
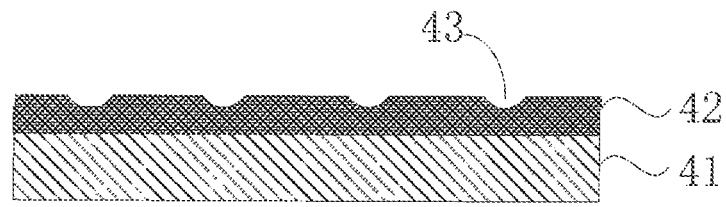
FIG. 4 is a diagram showing a section of a sub-aluminum film defining a plurality of notches each having a hexagonal close-packed structure according to the first preferred embodiment of the present invention.

The aluminum oxide is removed by using the sodium hydroxide solution, so that the aluminum film having the plurality of notches each having a hexagonal close-packed structure is formed. FIG. 4 is a diagram showing a section of a sub-aluminum film having a plurality of notches each having a hexagonal close-packed structure according to this preferred embodiment. There are serval notches 43 in the sub-aluminum film 42 of the base 41, and the notches 43 each have a hexagonal close-packed structure. It should be understood that on the base 41, the sub-aluminum film has nine notches each having a hexagonal close-packed structure (as shown in FIG. 4).

The quantity of the notches each having a hexagonal close-packed structure formed in each sub-aluminum film is quite large, which may be over hundreds of millions, so that the notches cannot be distinguished at a macroscopic scope. However, at a microscopic scope, the plurality of notches are arranged in an order, for example, in a range of 10 notches, the notches are regularly arranged.

In the step S203, the aluminum film having the plurality of notches each having a hexagonal close-packed structure is then subject to a second anodic oxidation by using the oxalic acid solution. Due to an oxidation mechanism of the aluminum, the oxidation rate on the aluminum located below the notches is greater than the aluminum located on the other portion. The aluminum located below the notches is continuously oxidized to form aluminum oxide. The aluminum oxide thus formed will spread to the surroundings of the notches, thereby completely oxidizing the aluminum located under the notches to form the hole structures. Thus, the process of manufacturing and providing the mask having the plurality of hole structures on the base is accomplished and the hole structures each have a hexagonal close-packed structure. As the description above, it can be noted that the mask includes nine sub-masks in this preferred embodiment, and each sub-mask corresponds to one sub-aluminum film.

Figure 5A:
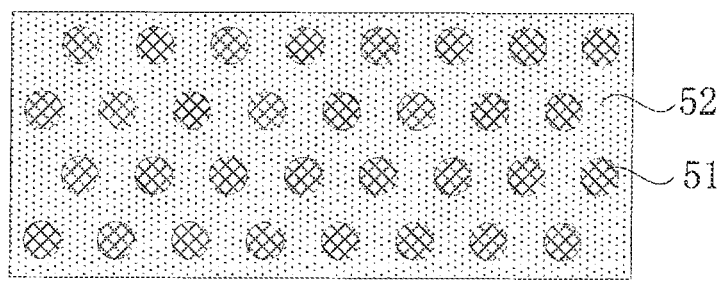
FIG. 5a is a top schematic view of the sub-mask according to the first preferred embodiment of the present invention.
Figure 5B:
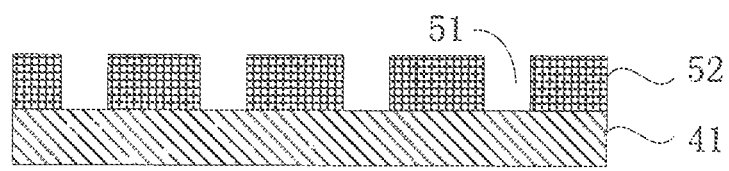
FIG. 5b is a side schematic view of the sub-mask showing the hole structures thereof according to the first preferred embodiment of the present invention.

Please refer to FIGS. 5a and 5b. FIG. 5a is a top schematic view of the sub-mask according to this preferred embodiment of the present invention, and FIG. 5b is a side schematic view of the sub-mask having the hole structures according to this preferred embodiment of the present invention. As shown in FIG. 5a, there are a plurality of hole structures 51 in the sub-mask, and the hole structures 51 are surrounded by aluminum oxide 52.

In this preferable embodiment, in the process of manufacturing the mask, the aluminum film is anodized twice for forming the mask having the hole structures. In the other embodiments, the aluminum film can be anodized once, thrice, or more times to form the mask having the hole structures, which will not be specifically restricted in the invention.

In this preferable embodiment, in the step S101, the base may be a glass base. In the other embodiments, the base may be made by other material, which will not be specifically restricted in the invention.

In the step S102, a material having a first refractive index value is deposited in the hole structures of the mask by using a chemical vapor deposition method. In the other embodiments, the material having the first refractive index value can be deposited by using a vacuum evaporation, a physical vapor deposition, a pulsed laser deposition, or other method, which will not be specifically restricted in the invention.

In this preferable embodiment, the first refractive index value should be less than or equal to 1.5. Preferably, the material having the first refractive index value is silicon dioxide. In the other embodiments, the material may be a silicon-glass bonding structure material or an aerogel material, or combinations thereof, which will not be specifically restricted in the invention.

Figure 6:
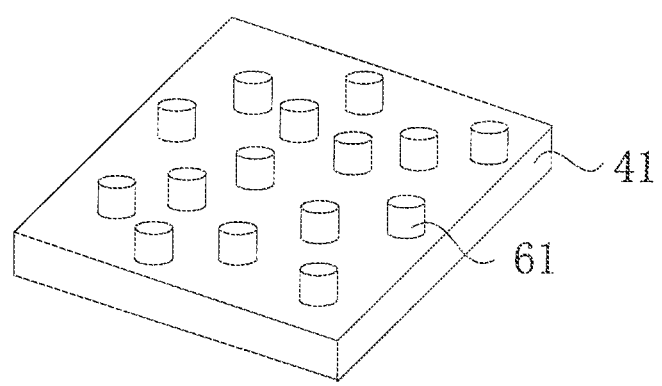
FIG. 6 is a diagram showing the base being formed with a plurality of raised structures thereon corresponding to the sub-mask according to the first preferred embodiment of the present invention.

In the step S103, after the silicon dioxide material is deposited, the mask is removed by using sodium hydroxide solution. After the mask is removed, a plurality of silicon dioxide raised structures are formed on the base 41. Please refer to FIG. 6, which is a diagram showing a plurality of raised structures being formed on the base corresponding to the sub-mask according to this preferred embodiment of the present invention. In the step S102, due to the amount of the deposited silicon dioxide is greater, the raised structures are columnar structures in this embodiment (as shown in FIG. 6, the silicon dioxide raised structure 61). In the other embodiments, hemispherical-shaped raised structures can be formed on the base 41 by decreasing the amount of deposited silicon dioxide. The specific operation process for forming the hemispherical-shaped raised structures can be easily implemented by those skilled in the art from the description of the present invention and general knowledge of the art, whereby the specific operation process will not be described in detail here.

Figure 7:
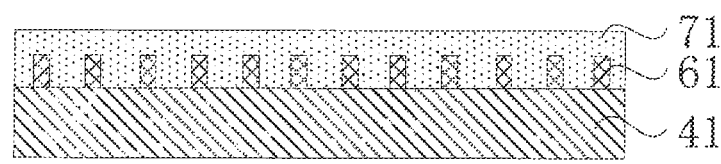
FIG. 7 is a structural diagram showing the light scattering layer being manufactured on the base according to the first preferred embodiment of the present invention.

In the step S104, a material having a second refractive index value is deposited between the plurality of silicon dioxide raised structures 61 for forming a planarization layer, where the second refractive index value is greater than the first refractive index value. In this embodiment, preferably, the second refractive index value is greater than or equal to 1.8. Preferably, the material having the second refractive index value may be tin indium oxide. The plurality of silicon dioxide raised structures 61 are covered by the deposition of the tin indium oxide planarization layer, thereby forming the light scattering layer constituted by the silicon dioxide raised structures and the tin indium oxide planarization layer on the base. As shown in FIG. 7, which is a structural diagram showing the light scattering layer being manufactured on the base according to this preferred embodiment. The light scattering layer comprises the silicon dioxide raised structures 61 and the tin indium oxide planarization layer 71.

In this preferred embodiment, since an electrode material of the organic light-emitting diode, i.e., tin indium oxide, is employed to be a material of the planarization layer 71, the light scattering layer not only can scatter light, but also server as the electrode of the organic light-emitting diode, thereby decreasing the manufacturing cost of the organic light-emitting diode. In the other embodiments, the material of the planarization layer 71 can be zinc selenide, or silicon nitride, or combinations thereof, which will not be specifically restricted in the invention.

In the method of manufacturing the light scattering layer of this preferred embodiment, the mask having the plurality of hole structures is directly formed on the base, and then the material having the first refractive index value is deposited in the hole structures of the mask, and then the raised structures is covered by using the material having the second refractive index value which is used to form the planarization layer, thereby forming the light scattering layer constituted by the plurality of raised structures and the planarization layer on the base. The process of manufacturing the light scattering layer is simple, and the manufacturing cost is low. The light scattering effect of the light scattering layer can be accurately controlled by controlling the factors regarding the shape or the quantity of the raised structures. Moreover, by using this method, the light scattering layer can be produced in a mass production manner while have the same constituted structure, so as to solve the technical problems of the prior art that the light scattering layer can not have a uniform light scattering effect due to its constituted structure is randomly arranged and not always the same. In addition, in accordance with the present invention, the light scattering layer with an appropriate constituted structure may be prepared according to an actual requirement, thereby obtaining a respectively required light scattering effect.

Figure 8:
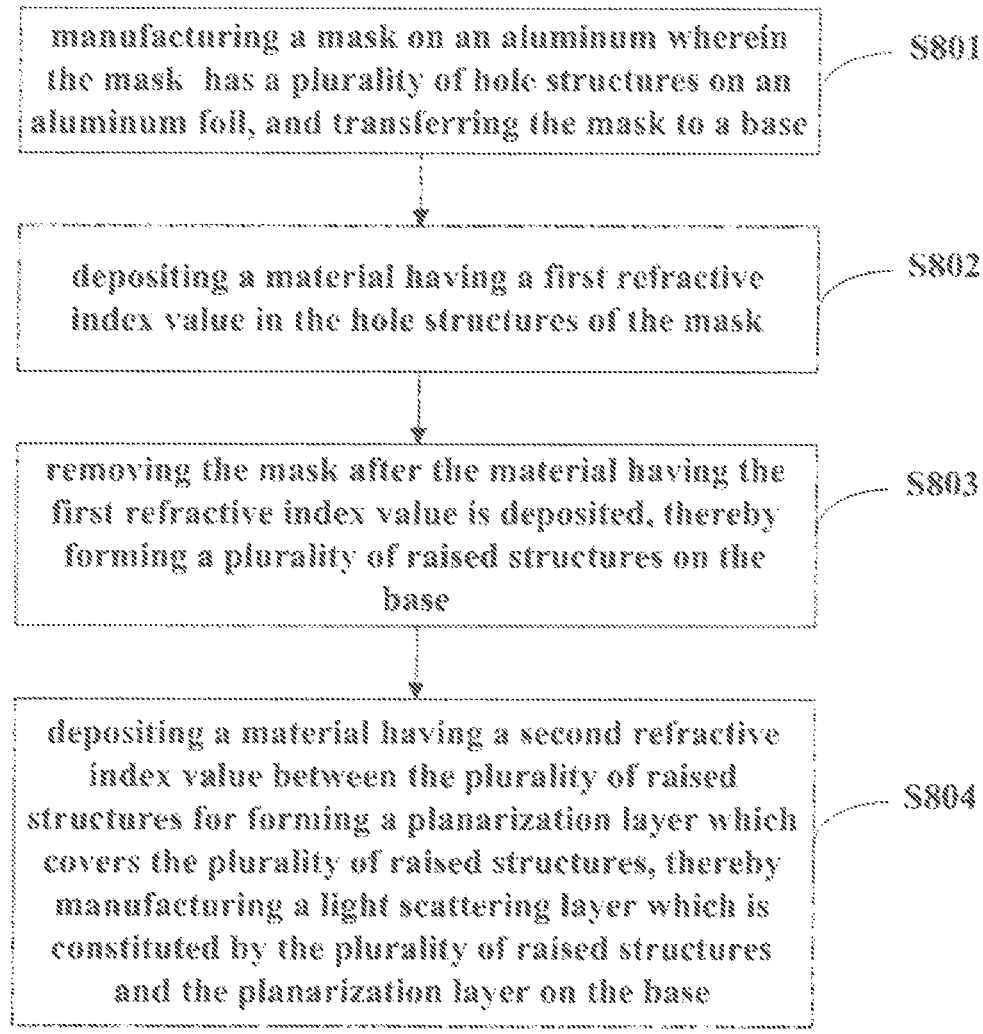
FIG. 8 is a flow chart of a method of manufacturing the light scattering layer according to a second preferred embodiment of the present invention.

Please refer to FIG. 8, which is a flow chart of a method of manufacturing the light scattering layer in accordance with a second preferred embodiment of the present invention. The method of manufacturing the light scattering layer of this preferred embodiment comprises:

Step S801, manufacturing a mask on an aluminum wherein the mask has a plurality of hole structures on an aluminum foil, and transferring the mask to a base;

Step S802, depositing a material having a first refractive index value in the hole structures of the mask;

Step S803, removing the mask after the material having the first refractive index value is deposited, thereby forming a plurality of raised structures on the base;

Step S804, depositing a material having a second refractive index value between the plurality of raised structures for forming a planarization layer which covers the plurality of raised structures, thereby manufacturing a light scattering layer which is constituted by the plurality of raised structures and the planarization layer on the base, where the second refractive index value is greater than the first refractive index value.

The specific processes of each step of the method of manufacturing the light scattering layer of this preferred embodiment are descripted below.

Figure 9:
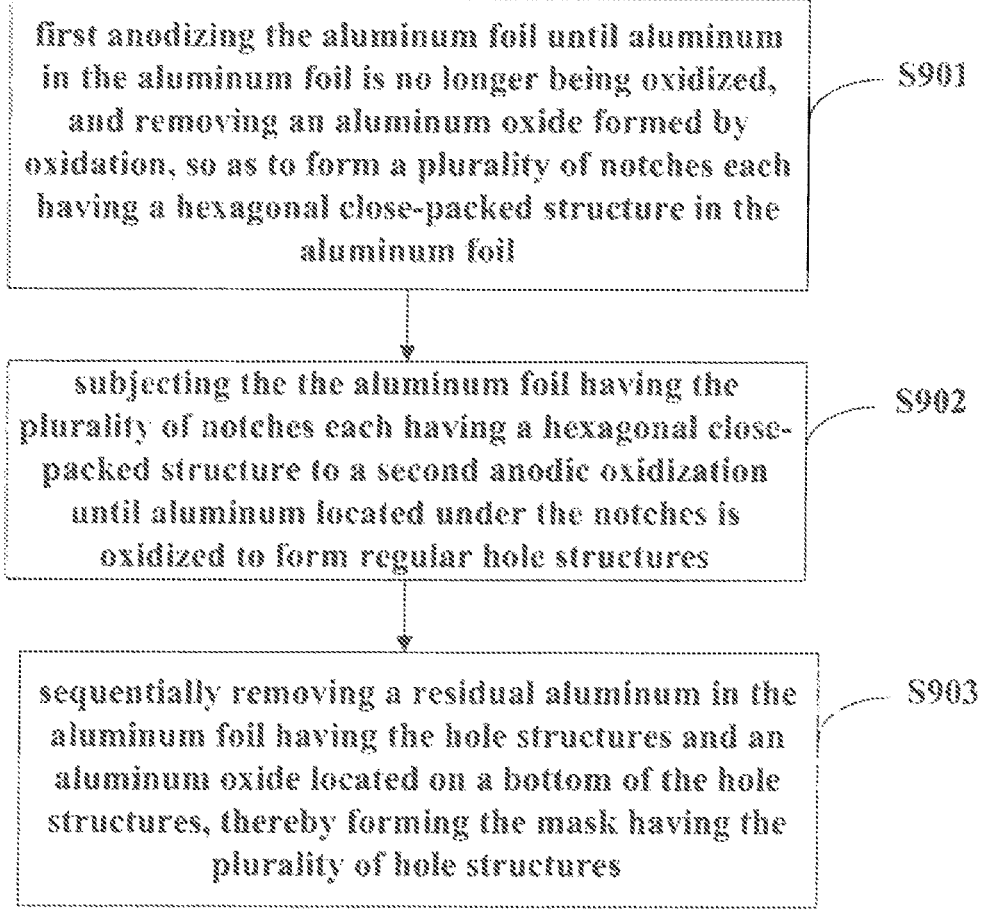
FIG. 9 is a flow chart of a method of manufacturing a mask according to the second preferred embodiment of the present invention.

In the step S801, an aluminum foil having a thickness of 2 mm is employed to be a material for manufacturing the mask having a plurality of hole structures. In this step, the specific process of manufacturing the mask is as shown in FIG. 9. FIG. 9 is a flow chart of a method of manufacturing a mask according to this preferred embodiment.

The specific process of manufacturing the mask comprises:

Step S901, first anodizing the aluminum foil until aluminum in the aluminum foil is no longer being oxidized, and removing an aluminum oxide formed by oxidation, so as to form a plurality of notches each having a hexagonal close-packed structure in the aluminum foil;

Step S902, subjecting the aluminum foil having the plurality of notches each having a hexagonal close-packed structure to a second anodic oxidization until aluminum located under the notches is oxidized to form regular hole structures;

Step S903, sequentially removing a residual aluminum in the aluminum foil having the hole structures and an aluminum oxide located on a bottom of the hole structures, thereby forming the mask having the plurality of hole structures.

In the step S901, the aluminum foil is first anodized by using the oxalic acid solution. The surface of the aluminum is rapidly oxidized to form a layer of aluminum oxide, such that the aluminum film is constituted by a non-oxide aluminum layer and an aluminum oxide layer. Due to the surface of the aluminum oxide layer having asperities, the current in the recesses of the asperities is great, and the oxidation speed therein by the oxalic acid is fast. Moreover, current at the protrusions of the asperities is small, and the oxidation speed thereat by the oxalic acid solution is slow. Thus, the recesses will extend transversely and longitudinally, thereby forming notches. The protrusions serve as side walls of the notches. By controlling the time of performing the first anodizing, the aluminum film having the notches can be obtained. The lower half portion of the notch is extended into the non-oxide aluminum layer, and formed with regular a hexagonal close-packed structure. The upper half portion of the notch is located in the newly formed aluminum oxide layer. It should be noted that the transverse direction and the longitudinal direction are respectively used to refer a direction parallel to the surface of the aluminum film and a direction perpendicular to the surface of the aluminum film.

With the aluminum being gradually oxidized to form the aluminum oxide, a thick protective film will be formed on a surface of the aluminum foil from the aluminum oxide thus formed, thereby preventing the inside aluminum from being further oxidized by the oxalic acid solution, such that the aluminum will be oxidized to an extent, and then the oxidation is stopped. This process is a complete oxidation process of the aluminum foil.

Figure 10:
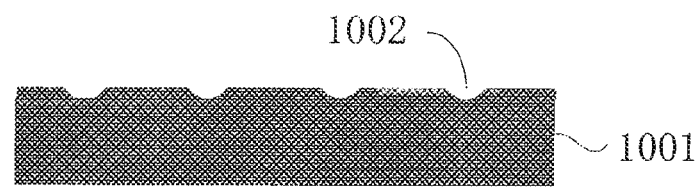
FIG. 10 is a diagram showing a section of an aluminum foil defining a plurality of notches each having a hexagonal close-packed structure according to the second preferred embodiment of the present invention.

After the aluminum foil is oxidized, the thus formed aluminum oxide is removed by using sodium hydroxide solution, thereby forming the aluminum foil having notches each having a hexagonal close-packed structure. FIG. 10 is a diagram showing a section of the aluminum foil having the plurality of notches each having a hexagonal close-packed structure according to this preferred embodiment. As will be appreciated from the figure, a series of notches 1002 are formed in the surface of the aluminum foil 1001, and the notches 1002 each are formed with a hexagonal close-packed structure. The principle of forming the notches each having a hexagonal close-packed structure has been stated previously, the description thereof will not be repeated.

Figure 11:
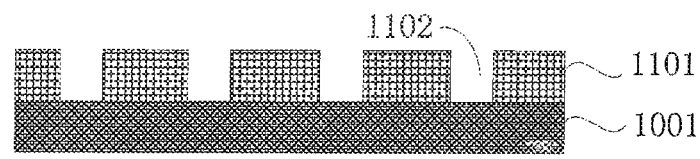
FIG. 11 is a side schematic view showing the aluminum foil having hole structures formed therein according to the second preferred embodiment of the present invention.

In the step S902, the aluminum foil 1001 having the plurality of notches each having a hexagonal close-packed structure is subject to a second anodic oxidation by using the oxalic acid solution. Due to an oxidation mechanism of the aluminum, the oxidation rate on the aluminum located below the notches is greater than the aluminum located on the other portion, the aluminum located below the notches is continuously oxidized to form aluminum oxide. The thus formed aluminum oxide will spread to the surroundings of the notches, thereby oxidizing the aluminum located under the notches to form the regular hole structures. FIG. 11 is a side schematic view showing the hole structures formed in the aluminum foil according to this preferred embodiment. The aluminum foil comprises three portions, one is a residual aluminum foil 1001, another is the aluminum oxide

1101 formed by oxidation, and the other one is the hole structures 1102. It should be understood that the aluminum oxide is located on a bottom of the hole structure 1102, where the aluminum foil 1001 is at the bottom of the hole structures 1102.

In the step S903, the residual aluminum foil 1001 can be removed by using the copper chloride solution, and the aluminum oxide located around the bottom of the hole structures 1102 is removed by using the phosphoric acid solution, such that the hole structures 1102 becomes through hole structures. That is, the mask having the plurality of hole structures is formed.

In this preferable embodiment, in the process of manufacturing the mask, the aluminum foil is anodized twice for forming the mask having the hole structures. In the other embodiments, the aluminum film can be anodized once, thrice, or more times to form the mask having the hole structures, which will not be specifically restricted in the invention.

The thus completed mask is transferred to the base. In this embodiment, the base may be a glass base or may be made from a material for manufacturing a cathode of the organic light-emitting diode. If the base is the glass base, the light scattering layer made from the manufacturing method of this preferred embodiment can be employed in a bottom-emitting organic light-emitting diode. If the base is made from the material for manufacturing the cathode of the organic light-emitting diode, such as a metal film, the light scattering layer made from the manufacturing method of this preferred embodiment can be employed in a top-emitting organic light-emitting diode. The base is not limited to the above two kinds, and the base can be selected according to the actual application situation, which will not be specifically restricted in the invention.

In the step S802, after the mask is transferred to the base, the material having the first refractive index value is deposited in the hole structures of the mask by using the chemical vapor deposition method. In the other embodiments, the material having the first refractive index value can be deposited by other methods, such as vacuum evaporation method, physical vapor deposition method, pulsed laser deposition method, etc., which will not be specifically restricted in the invention.

In this preferable embodiment, the first refractive index value should be less than or equal to 1.5. Preferably, the material having the first refractive index value is silicon dioxide. In the other embodiments, the material may be a silicon-glass bonding structure material or an aerogel material, or combinations thereof, which will not be specifically restricted in the invention.

In the step S803, after depositing the silicon dioxide material, the mask is removed by using the sodium hydroxide solution. After the mask is removed, a plurality of silicon dioxide raised structures are formed on the base, the specific structure is as shown in FIG. 6. In the step S802, due to the amount of the deposited silicon dioxide is greater, the raised structures are columnar structures in this embodiment. In the other embodiments, hemispherical-shaped raised structures can be formed on the base by decreasing the amount of deposited silicon dioxide. The specific operation process for forming the hemispherical-shaped raised structures can be easily implemented by those skill in the art from the description of the present invention and general knowledge of the art, whereby the specific operation process will not be described in detail here.

In the step S804, a material having a second refractive index value is deposited between the plurality of silicon dioxide raised structures for forming a planarization layer, where the second refractive index value is greater than the first refractive index value. In this embodiment, preferably, the second refractive index value is greater than or equal to 1.8. Preferably, the material having the second refractive index value may be tin indium oxide. The plurality of silicon dioxide raised structures are covered by the deposition of the tin indium oxide planarization layer, thereby forming the light scattering layer constituted by the silicon dioxide raised structures and the tin indium oxide planarization layer on the base.

In this preferred embodiment, since an electrode material of the organic light-emitting diode, i.e., tin indium oxide, is employed to be a material of the planarization layer, the light scattering layer not only can scatter light, but also server as the electrode of the organic light-emitting diode, thereby decreasing the manufacturing cost of the organic light-emitting diode. In the other embodiments, the material of the planarization layer can be zinc selenide, or silicon nitride, or combinations thereof, which will not be specifically restricted in the invention.

In the method of manufacturing the light scattering layer of this preferred embodiment, the mask having the hole structures is firstly formed on the aluminum foil, and then the mask is transferred to the base, and then the material having the first refractive index value is deposited in the hole structures of the mask. Then, the raised structures are covered by using the material having the second refractive index value which forms the planarization layer, thereby forming the light scattering layer constituted by the plurality of raised structures and the planarization layer on the base. The process of manufacturing the light scattering layer is simple, and the manufacturing cost is low. The light scattering effect of the light scattering layer can be accurately controlled by controlling the factors regarding the shape or the quantity of the raised structures. In addition, the light scattering layer with an appropriate internal structure may be prepared according to actual requirements, thereby obtaining a respectively required scattering effect.

The present invention also provides an organic light-emitting diode. For the bottom-emitting organic light-emitting diode, the organic light-emitting diode comprises, from top down, a cathode, an organic material layer, an ITO anode, a light scattering layer, and a base, where the direction from the top to bottom is used to descript a positional relationship between all of the elements.

In this preferred embodiment, the bottom-emitting organic light-emitting diode is specified in detail below. The light scattering layer used in the organic light-emitting diode is made by the manufacturing method of the light scattering layer according to the first preferred embodiment of the present invention. The working principle and process of the organic light-emitting diode belong to existing technology, which those skilled in the art can carry out based on their general knowledge, so that the working principle and process of the organic light-emitting diode will not be described in detail here for simplicity of the description.

After the light scattering layer is disposed between the ITO anode and the base of the organic light-emitting diode, how to reduce the wave guide mode to increase the efficiency of light emission of the organic light-emitting diode is described in detail below.

In this embodiment, the light scattering layer comprises the regular raised structures having the first refractive index value and the planarization layer having the second refractive index value. The material of the raised structures having the first refractive index value is silicon dioxide, and the material of the planarization layer material having the second refractive index value is tin indium oxide. It should be understood that in this preferred embodiment, the light scattering layer is made by an electrode material of the organic light-emitting diode, i.e., tin indium oxide material, such that the light scattering layer is integrated with the ITO anode. This method can reduce the manufacturing cost of the organic light-emitting diode, and reduce the quantity of inner layers of the organic light-emitting diode, thereby decreasing the thickness of the organic light-emitting diode.

Figure 12:
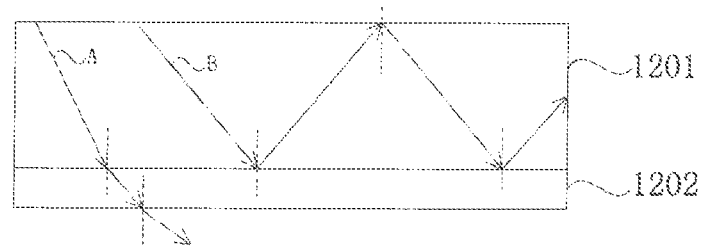
FIG. 12 is a light path diagram showing a wave guide mode in an organic light-emitting diode in accordance with the prior art.

Please refer to FIG. 12, which is a light path diagram showing a wave guide mode in an organic light-emitting diode in the prior art. For the conventional bottom-emitting organic light-emitting diode, the ITO anode 1201 is directly contacted with the glass base 1202. After the light from the organic material layer emits into the ITO anode 1201, a portion of light is totally reflected at an interface of the ITO anode 1201 and the glass base 1202 due to the refractive index of the ITO anode 1201 is greater than the refractive index of the glass base 1202. Refer to the light path diagram of light B in FIG. 12, the light B will be totally reflected repeatedly within the ITO anode 1201, such that the light B cannot emit out from the ITO anode 1201. In this case, the light B is called the wave guide mode. That is, for the light B, the ITO anode 1201 serves as a wave guide device, so the light B will be totally reflected repeatedly within the ITO anode 1201. For another light A, since an incidence angle of the light A is smaller than a total reflection critical angle of the ITO anode 1201 and the glass base 1202, the light A will be refracted from the ITO anode 1201 to the glass base 1202, thereby emitting out from the glass base 1202 of the organic light-emitting diode. In the conventional organic light-emitting diode, a portion of light is totally reflected, so it cannot emit out, such that the efficiency of light emission is greatly reduced.

Figure 13:
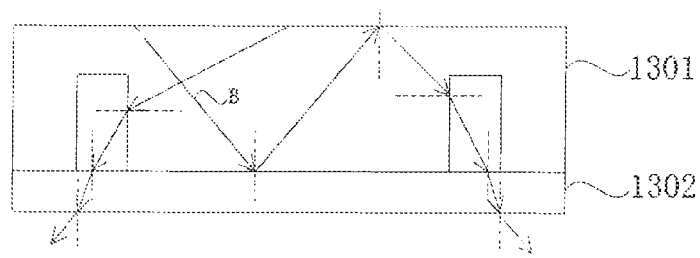
FIG. 13 is a light path diagram of a light scattering layer in an organic light-emitting diode in accordance with the present invention.

In this preferred embodiment, the light scattering layer is disposed between the ITO anode and the glass base. Preferably, the ITO anode is integrated with the planarization layer. That is, when manufacturing the light scattering layer, the planarization layer is made by using ITO material. Please refer to FIG. 13, which is a light path diagram of a light scattering layer in an organic light-emitting diode of the present invention After the light from the organic material layer emits into the light scattering layer 1301, a portion of light is totally reflected at an interface of the light scattering layer 1301 and the glass base 1302 due to the refractive index of the light scattering layer 1301 is greater than the refractive index of the glass base 1302. Refer to light B in FIG. 13, after the light B is totally reflected twice within the light scattering layer 1301, the light B will travel to a side surface of the silicon dioxide raised structures in the light scattering layer 1301. Since the refractive index of the silicon dioxide raised structure is smaller than the tin indium oxide, and an incidence angle of the light B to the silicon dioxide raised structures is smaller than a total reflection critical angle, the light B will be refracted at the surface of the silicon dioxide raised structure. That is, a propagation direction of the light B is changed, such that the B-light can emit out from the glass base 1302, thereby reducing the production of the wave guide mode in the organic light-emitting diode. Hence, the efficiency of light emission of the organic light-emitting diode in this preferred embodiment is greater than the efficiency of light emission of the conventional organic light-emitting diode.

In the top-emitting organic light-emitting diode, the light scattering layer is employed, so that the principle of reducing the wave guide mode is the same as the bottom-emitting organic light-emitting diode, and will not be described in any great detail.

In conclusion, although the present disclosure is disclosed above by using preferred embodiments, the foregoing preferred embodiments are not intended to limit the present disclosure. A person of ordinary skill in the art may make various change or modification within the spirit and principle of the present disclosure. Therefore, the protection scope of the present disclosure is subject to the scope defined by the claims.

What is claimed is:

1. A method of manufacturing a light scattering layer, comprising:
   manufacturing a mask on a base, the mask having a plurality of hole structures;
   depositing a material having a first refractive index value in the hole structures of the mask;
   removing the mask after the material having the first refractive index value is deposited, thereby forming a plurality of raised structures on the base;
   depositing a material having a second refractive index value between the plurality of raised structures for forming a planarization layer which is used for covering the plurality of raised structures, thereby manufacturing a scattering layer which is constituted by the plurality of raised structures and the planarization layer on the base, wherein the second refractive index value is greater than the first refractive index value,
   wherein the step of manufacturing a mask having a plurality of hole structures on a base comprises:
   employing an open mask on the base and manufacturing an aluminum film by the open mask, where a pattern of the aluminum film is the same as a pattern of the open mask by using a vacuum evaporation method or a physical vapor deposition method;
   anodizing the aluminum film first time and removing an aluminum oxide formed by oxidation, so as to form the aluminum film having a plurality of notches each having a hexagonal close-packed structure; and
   anodizing the aluminum film having the plurality of notches each having a hexagonal close-packed structure second time until aluminum located under the notches is completely oxidized to form the hole structures.

2. The method of manufacturing the light scattering layer as claimed in claim 1, wherein a thickness of the aluminum film is in a range between 2 micrometers and 10 micrometers.

3. The method of manufacturing the light scattering layer as claimed in claim 1, wherein processes of the first anodization and second anodization of the aluminum film are performed in an oxalic acid solution.

4. The method of manufacturing the light scattering layer as claimed in claim 1, wherein the step of removing an aluminum oxide formed by oxidation comprises: removing the aluminum oxide by using a sodium hydroxide solution.

5. The method of manufacturing the light scattering layer as claimed in claim 1, wherein in the step of depositing a material having a first refractive index value in the hole structures of the mask, the depositing process is performed by using a vacuum evaporation method, a physical vapor deposition method, a chemical vapor deposition method, or a pulsed laser deposition method.

6. The method of manufacturing the light scattering layer as claimed in claim 1, wherein the raised structures comprise hemispherical-shaped raised structures or columnar raised structures.

7. The method of manufacturing the light scattering layer as claimed in claim 1, wherein the material having the first refractive index value is selected from the group consisting of a silicon-glass bonding structure material, a silicon dioxide material, and an aerogel material.

8. The method of manufacturing the light scattering layer as claimed in claim 1, wherein the material having the second refractive index value is selected from the group consisting of a silicon nitride material, a tin indium oxide material, and a zinc selenide material.

9. The method of manufacturing the light scattering layer as claimed in claim 1, wherein the base comprises a glass base.

10. A method of manufacturing a light scattering layer, comprising:
   manufacturing a mask on an aluminum foil, the mask having a plurality of hole structures, and transferring the mask to a base;
   depositing a material having a first refractive index value in the hole structures of the mask;
   removing the mask after the material having the first refractive index value is deposited, thereby forming a plurality of raised structures on the base;
   depositing a material having a second refractive index value between the plurality of raised structures for forming a planarization layer which is used for covering the plurality of raised structures, thereby manufacturing a light scattering layer which is constituted by the plurality of raised structures and the planarization layer on the base, wherein the second refractive index value is greater than the first refractive index value.

11. The method of manufacturing the light scattering layer as claimed in claim 10, wherein the step of manufacturing a mask having a plurality of hole structures on an aluminum foil comprises:
   anodizing the aluminum foil first time until aluminum in the aluminum foil is no longer being oxidized, and removing an aluminum oxide formed by oxidation, so as to form a plurality of notches each having a hexagonal close-packed structure in the aluminum foil;
   anodizing the aluminum foil having the plurality of notches each having hexagonal close-packed structure second time until aluminum located under the notches is oxidized to form regular hole structures;
   sequentially removing a residual aluminum in the aluminum foil having the hole structures and an aluminum oxide located around a bottom of the hole structures, thereby forming the mask having the plurality of hole structures.

12. The method of manufacturing the light scattering layer as claimed in claim 11, wherein processes of the first anodization and second anodization of the aluminum foil are performed in an oxalic acid solution.

13. The method of manufacturing the light scattering layer as claimed in claim 11, wherein the step of removing an aluminum oxide formed by oxidation comprises: removing the aluminum oxide by using a sodium hydroxide solution.

14. The method of manufacturing the light scattering layer as claimed in claim 11, wherein the step of removing a residual aluminum in the aluminum foil having the hole structures comprises: removing the residual aluminum by using a copper chloride solution.

15. The method of manufacturing the light scattering layer as claimed in claim 10, wherein the step of removing an aluminum oxide located around a bottom of the hole structures comprises: removing the aluminum oxide located around the bottom of the hole structures by using a phosphoric acid solution.

16. The method of manufacturing the light scattering layer as claimed in claim 10, wherein the material having the first refractive index value is selected from the group consisting of a silicon-glass bonding structure material, a silicon dioxide material, and an aerogel material.

17. The method of manufacturing the light scattering layer as claimed in claim 10, wherein the material having the second refractive index value is selected from the group consisting of a silicon nitride material, a tin indium oxide material, and a zinc selenide material.

18. The method of manufacturing the light scattering layer as claimed in claim 10, wherein the raised structures comprise hemispherical-shaped raised structures or columnar raised structures.

19. An organic light-emitting diode, comprising a cathode, an organic material layer, an ITO anode, and a base, wherein the organic light-emitting diode further comprises a light scattering layer obtained from the manufacturing method of claim 1, the light scattering layer is located between the ITO anode and the base, or the light scattering layer is located on a side of the cathode.

* * * * *